United States Patent
Fujiki et al.

(10) Patent No.: US 7,622,346 B2
(45) Date of Patent: Nov. 24, 2009

(54) METHOD FOR FORMING FERROELECTRIC CAPACITOR AND METHOD FOR FABRICATING SEMICONDUCTOR DEVICE

(75) Inventors: Mitsushi Fujiki, Kawasaki (JP); Katsuyoshi Matsuura, Kawasaki (JP); Genichi Komuro, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 530 days.

(21) Appl. No.: 11/455,795

(22) Filed: Jun. 20, 2006

(65) Prior Publication Data
US 2007/0196932 A1 Aug. 23, 2007

(30) Foreign Application Priority Data
Feb. 20, 2006 (JP) .............................. 2006-042905

(51) Int. Cl.
*H01L 21/8242* (2006.01)
(52) U.S. Cl. ............... 438/239; 438/396; 257/E21.663; 257/E21.664
(58) Field of Classification Search .............. 438/3, 438/239, 240, 396; 257/295, 306, E21.208, 257/E21.663, E21.664
See application file for complete search history.

(56) References Cited

U.S. PATENT DOCUMENTS 6,740,533 B2 * 5/2004 Takamatsu et al. ............. 438/3
6,770,525 B2 * 8/2004 Lee et al. ..................... 438/239
6,852,136 B2 * 2/2005 Park et al. ................... 29/25.03

FOREIGN PATENT DOCUMENTS

JP  2001-126955 (A)  5/2001
JP  2002-246564 (A)  8/2002

* cited by examiner

*Primary Examiner*—Khiem D Nguyen
(74) *Attorney, Agent, or Firm*—Westerman, Hattori, Daniels & Adrian, LLP

(57) ABSTRACT

A ferroelectric capacitor formation method necessary for stably fabricating an FeRAM and a semiconductor device fabrication method. After a PZT film is deposited on a lower electrode layer, the PZT film is crystallized by performing heat treatment in an atmosphere of a mixed gas which contains $O_2$ gas and Ar gas. In this case, the flow rate of the $O_2$ gas is controlled by one mass flow controller. The flow rate of the Ar gas used for purging and the flow rate of the Ar gas used for adjusting $O_2$ gas concentration are controlled by different mass flow controllers. Before raising the temperature, the $O_2$ gas, the Ar gas used for purging, and the Ar gas used for adjusting $O_2$ gas concentration are made to flow at predetermined flow rates. Only the Ar gas used for purging is stopped, raising the temperature is begun, and the heat treatment is performed. At this time the $O_2$ gas and the Ar gas used for adjusting $O_2$ gas concentration flow at the predetermined flow rates. As a result, an atmosphere in which the heat treatment is performed for crystallizing the PZT film can be stabilized. Accordingly, a ferroelectric capacitor having predetermined performance is stably formed and an FeRAM is stably fabricated.

18 Claims, 9 Drawing Sheets

METHOD FOR FORMING FERROELECTRIC CAPACITOR AND METHOD FOR FABRICATING SEMICONDUCTOR DEVICE

CROSS-REFERENCE TO RELATED APPLICATIONS

This application is based upon and claims the benefits of priority from Japanese Patent Application No. 2006-042905, filed on Feb. 20, 2006, the entire contents of which are incorporated herein by reference.

BACKGROUND OF THE INVENTION (1) Field of the Invention

This invention relates to a method for forming a ferroelectric capacitor and a method for fabricating a semiconductor device and, more particularly, to a method for forming a ferroelectric capacitor in which a ferroelectric material is used for forming a dielectric layer and a method for fabricating a semiconductor device having such a ferroelectric capacitor.

(2) Description of the Related Art

The polarization state of a ferroelectric material can be reversed by an external electric field. Nonvolatile semiconductor memories in which this characteristic is utilized, that is to say, ferroelectric random access memories (FeRAMs) have conventionally been developed and manufactured.

As with dynamic random access memories (DRAMs), each memory cell in FeRAMs includes a switching transistor and a capacitor. A ferroelectric material is used for forming a dielectric layer in this capacitor. For example, lead zirconate titanate (Pb(Zr,Ti)$O_3$), or PZT, is used as such a ferroelectric material.

A ferroelectric capacitor included in such an FeRAM is obtained by forming a lower electrode layer, a layer of a ferroelectric material, and an upper electrode layer by, for example, a sputtering method. In this case, annealing treatment is performed under predetermined conditions at the time of forming the layer of a ferroelectric material in order to crystallize the ferroelectric material which is formed as a film and which is in an amorphous state (see Japanese Patent Laid-Open Publication Nos. 2001-126955 and 2002-246564).

By the way, the polarization axis of the tetragonal PZT orients in the (001) direction. Therefore, the polarization value of the tetragonal PZT is greatest when it is oriented in the c-axis direction. Usually, however, it is difficult to form PZT oriented in the c-axis direction on a polycrystalline substrate.

Accordingly, to form a ferroelectric capacitor included in a FeRAM of PZT, platinum (Pt) the lattice constant of which is comparatively close to that of PZT is used first for forming a lower electrode layer. A Pt film formed by, for example, a DC sputtering method is apt to be oriented in the direction of the (111) plane, being the densest plane. A PZT layer is then formed on the Pt film so that the (111) plane will preferentially be oriented. If the PZT layer is formed in this way, a switching (polarization inversion) direction forms an angle of 45° with an inverted electric field. The polarization value of the PZT layer formed in this way is smaller than the polarization value of a PZT layer the (001) plane of which is preferentially oriented. However, the polarization value of the PZT layer formed in this way is comparatively great and this PZT layer can adequately be utilized as a nonvolatile memory. As a result, an FeRAM which has good characteristics and which is suitable for production can be fabricated.

For example, an RF sputtering method is used for forming the PZT layer on the lower electrode layer formed of platinum. The PZT layer immediately after the sputtering is in an amorphous state, so it is then crystallized by annealing treatment. In a conventional method for fabricating an FeRAM, annealing conditions are properly selected at the time of forming the PZT layer in this way so that the (111) plane of the PZT layer can preferentially be orientated.

To crystallize the formed PZT layer which is in an amorphous state, usually rapid thermal anneal (RTA) is performed in an atmosphere in which an oxidation gas, such as oxygen ($O_2$) exists by using a lamp annealer or the like. In this case, the following method has conventionally been adopted. After an wafer on which the PZT layer is formed is transported into a predetermined heat treatment system, air which flows into the heat treatment system with the wafer at transportation time is purged by passing a certain amount of $O_2$ gas and a large amount of a non-oxidation gas, such as an inert gas, in the heat treatment system. After the elapse of a certain period of time, the flow rate of the inert gas is reduced to set gas composition and a gas flow rate at the time of raising the temperature. Immediately after the gas composition and the gas flow rate are set, the raising of the temperature is begun. For example, a certain amount of $O_2$ gas and a large amount of argon (Ar) gas are used at the time of purging the air, and a mixed gas that contains the certain amount of $O_2$ gas and the Ar gas the flow rate of which is reduced is used at the time of raising the temperature.

FIG. 8 is a view for describing an example of a conventional crystallization annealing method. In FIG. 8, a horizontal axis indicates time and a vertical axis indicates a gas flow rate and temperature.

As shown in FIG. 8, when annealing treatment is performed for crystallizing the PZT layer, the wafer is transported into the heat treatment system. To purge the air which flows into the heat treatment system, a certain amount of $O_2$ gas and a large amount of Ar gas are introduced first into the heat treatment system at the same time. The flow rate of the $O_2$ gas is controlled by a mass flow controller, being a flow rate controller, and the flow rate of the Ar gas is controlled by another mass flow controller, being a flow rate controller. When the air is purged, the flow rate of the $O_2$ gas has already been set to a flow rate value required later at the time of raising and maintaining the temperature by using the mass flow controller. After the elapse of a certain period of time, the mass flow controller for Ar gas is adjusted to reduce the flow rate of the Ar gas. By doing so, a mixed gas several percent of which is the $O_2$ gas and the rest of which is the Ar gas is introduced into the heat treatment system. Immediately after that, the raising of the temperature is begun.

However, if this method is used, the composition (partial pressure) or flow rate of the mixed gas which contains the $O_2$ gas and the Ar gas may not be a target value at the time of beginning raising the temperature. Accordingly, even if crystallization annealing treatment is performed under the same conditions, PZT crystals having stable characteristics may not be obtained.

FIG. 9 shows an example of variation in the orientation rate of PZT obtained by using the conventional crystallization annealing method. In FIG. 9, a horizontal axis indicates a sample wafer number and a vertical axis indicates the orientation rate (%) of the (222) plane of the PZT layer.

After the crystallization annealing treatment, measurements are made by utilizing X-ray diffraction (XRD). Integrated intensity for the (101), (100), and (222) planes of the PZT layer is found from their diffraction peaks and the orientation rate of the (222) plane of the PZT layer is calculated by orientation rate (%) of (222) plane of PZT layer={integrated intensity for (222) plane of PZT layer}× 100/[{integrated intensity for (100) plane of PZT layer}+ {integrated intensity for (101) plane of PZT layer}+{integrated intensity for (222) plane of PZT layer}]

In FIG. 9, conditions under which crystallization annealing treatment is performed on each sample are the same.

As stated above, when the (001) plane of the PZT layer is preferentially orientated, its polarization value is greatest. From the viewpoint of FeRAM production, however, it is preferable that the (111) plane ((222) plane) should be preferentially oriented. If the (111) plane ((222) plane) is preferentially oriented, a switching direction forms an angle of 45° with an inverted electric field and a comparatively great polarization value is obtained. As can be seen from FIG. 9, if crystallization annealing treatment is performed under the same conditions, the orientation rate of the (222) plane of the PZT layer is 90% or greater for all samples. However, there is variation in the orientation rate of the (222) plane of the PZT layer among the samples.

The reason for this is that when crystallization annealing treatment is performed, not only the (222) plane but also the (100) and (101) planes of the PZT layer appear. If stable orientation is not realized, the amount of switching electric charges $Q_{SW}$ does not stabilize. As a result, the yield of ferroelectric capacitors or FeRAMs using such ferroelectric capacitors may fall.

SUMMARY OF THE INVENTION

The present invention was made under the background circumstances described above. An object of the present invention is to provide a ferroelectric capacitor fabrication method by which a ferroelectric capacitor having predetermined capacitor performance can stably be fabricated.

Another object of the present invention is to provide a method for fabricating a semiconductor device including a ferroelectric capacitor which is fabricated in this way and which has predetermined capacitor performance.

In order to achieve the above first object, a ferroelectric capacitor fabrication method in which a ferroelectric material is used for forming a dielectric layer is provided. This ferroelectric capacitor fabrication method comprises the processes of forming a lower electrode layer; forming a layer of the ferroelectric material on the lower electrode layer; controlling, after forming the layer of the ferroelectric material, a flow rate of an oxidation gas by one flow rate controller, controlling a flow rate of a non-oxidation gas by a plurality of flow rate controllers, and performing heat treatment in an atmosphere of a mixed gas which contains the oxidation gas and the non-oxidation gas; and forming at least part of an upper electrode layer on the layer of the ferroelectric material after the heat treatment.

Furthermore, in order to achieve the above first object, a ferroelectric capacitor fabrication method in which a ferroelectric material is used for forming a dielectric layer is provided. This ferroelectric capacitor fabrication method comprises the processes of forming a lower electrode layer; forming a layer of the ferroelectric material on the lower electrode layer; controlling, after forming the layer of the ferroelectric material, a flow rate of an oxidation gas by one flow rate controller, controlling a flow rate of a non-oxidation gas by one flow rate controller, and performing heat treatment by beginning raising temperature after stabilizing oxidation gas concentration in a mixed gas which contains the oxidation gas and the non-oxidation gas; and forming at least part of an upper electrode layer on the layer of the ferroelectric material after the heat treatment.

In addition, in order to achieve the above second object, a method for fabricating a semiconductor device including a ferroelectric capacitor is provided. This method comprises the processes of forming a lower electrode layer; forming a layer of the ferroelectric material on the lower electrode layer; controlling, after forming the layer of the ferroelectric material, a flow rate of an oxidation gas by one flow rate controller, controlling a flow rate of a non-oxidation gas by a plurality of flow rate controllers, and performing heat treatment in an atmosphere of a mixed gas which contains the oxidation gas and the non-oxidation gas; and forming at least part of an upper electrode layer on the layer of the ferroelectric material after the heat treatment.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

The structure of an FeRAM will be described first.

Figure 1:
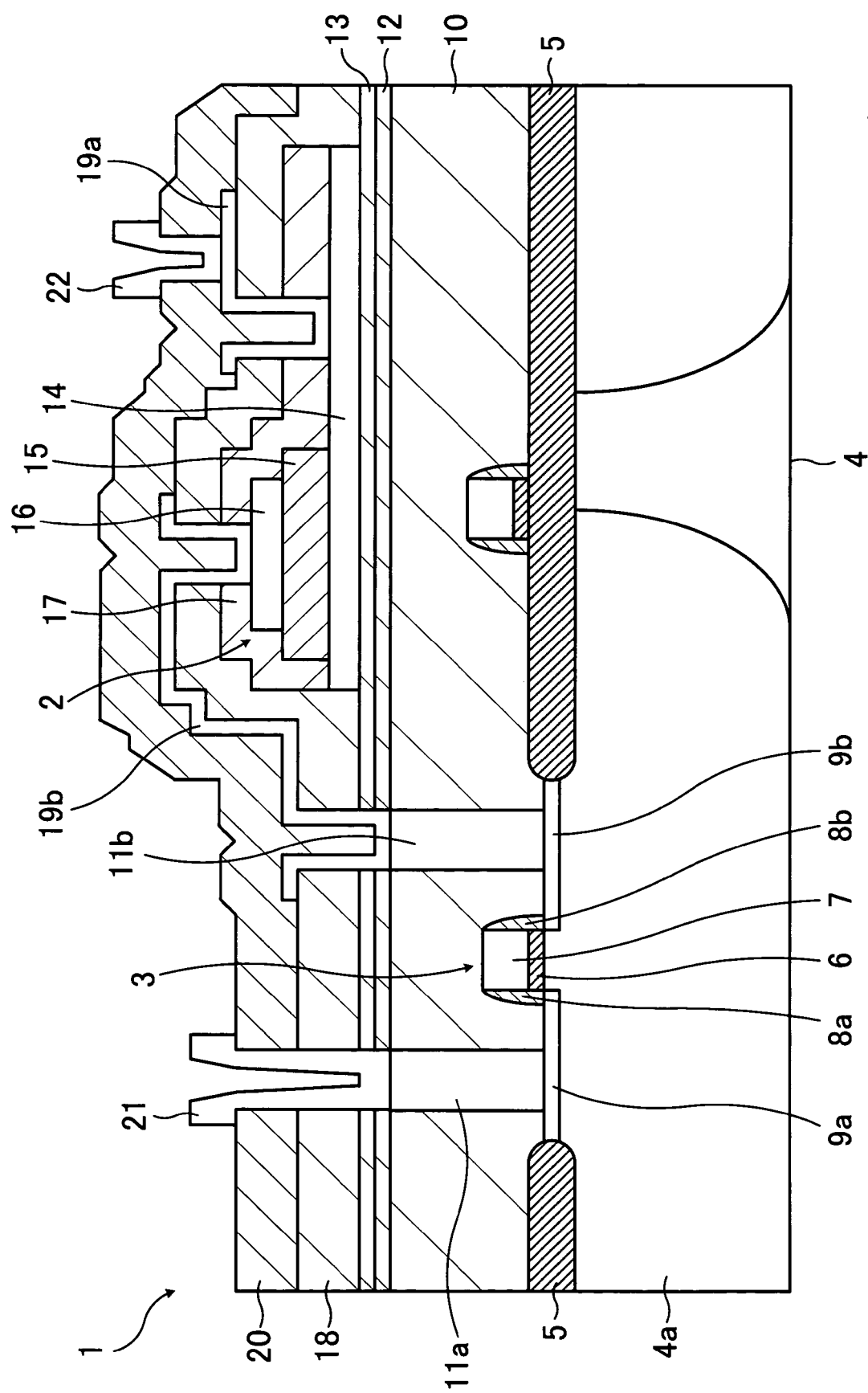
FIG. 1 is a schematic sectional view showing an important part of an example of an FeRAM.

FIG. 1 is a schematic sectional view showing an important part of an example of an FeRAM.

An FeRAM 1 includes a ferroelectric capacitor 2 for holding data and a metal oxide semiconductor (MOS) transistor 3 for accessing the ferroelectric capacitor 2.

The MOS transistor 3 is formed in an element region in a well 4a of a predetermined conduction type defined in a silicon (Si) substrate 4 by isolation regions 5 formed of, for example, a field oxide film. A gate electrode 7 which functions as a word line of the FeRAM 1 is formed over the Si substrate 4 with a gate insulating film 6 between. Sidewall insulating films 8a and 8b are formed on both sides of the gate electrode 7. Predetermined conduction-type impurity diffusion regions 9a and 9b are formed in the Si substrate 4 on both sides of the gate electrode 7.

An interlayer dielectric film 10 of, for example, silicon oxide ($SiO_2$) is formed on a wafer where the MOS transistor 3 having the above structure is formed. Plugs 11a and 11b of, for example, tungsten (W) are formed so that they will pierce through the interlayer dielectric film 10. The plugs 11a and 11b are connected to the impurity diffusion regions 9a and 9b respectively. An anti-oxidation film 12 of, for example, silicon oxynitride (SiON) and an $SiO_2$ film 13 are formed on the interlayer dielectric film 10. The ferroelectric capacitor 2 is formed on the $SiO_2$ film 13.

The ferroelectric capacitor 2 includes a lower electrode layer 14, a dielectric layer 15, and an upper electrode layer 16.

The lower electrode layer 14 has, for example, a structure in which a Pt film is formed on a titanium (Ti) film. The lower electrode layer 14 may be an iridium (Ir) film, a ruthenium (Ru) film, or a conductive oxide film such as an aluminum oxide ($Al_2O_3$) film, a ruthenium oxide ($RuO_2$) film, or a strontium ruthenate ($SrRuO_3$) film, or have a structure in which two of these films are formed properly with one on the other. The dielectric layer 15 is formed of, for example, PZT which is a ferroelectric material. The upper electrode layer 16 is formed of, for example, iridium oxide ($IrO_x$).

The lower electrode layer 14, the dielectric layer 15, and the upper electrode layer 16 included in the ferroelectric capacitor 2 are formed in tiers and an encap layer 17 is formed of, for example, PZT so as to cover the lower electrode layer 14, the dielectric layer 15, and the upper electrode layer 16.

Local wiring patterns 19a and 19b are connected to the lower electrode layer 14 and the upper electrode layer 16, respectively, in the ferroelectric capacitor 2 via contact holes which pierce through the encap layer 17 and an interlayer dielectric film 18 formed of, for example, $SiO_2$. The local wiring pattern 19b connected to the upper electrode layer 16 pierces through the interlayer dielectric film 18, the $SiO_2$ film 13, and the anti-oxidation film 12 and is connected to the plug 11b connected to the impurity diffusion region 9b of the MOS transistor 3. As a result, the ferroelectric capacitor 2 is electrically connected to the MOS transistor 3.

The entire element structure is covered with a passivation film 20 formed of, for example, $SiO_2$. An electrode 21 which pierces through the passivation film 20, the interlayer dielectric film 18, the $SiO_2$ film 13, and the anti-oxidation film 12 is connected to the plug 11a connected to the impurity diffusion region 9a of the MOS transistor 3. The electrode 21 functions as a bit line of the FeRAM 1. Another electrode 22 which pierces through the passivation film 20 is connected to the local wiring pattern 19a connected to the lower electrode layer 14.

Figure 2:
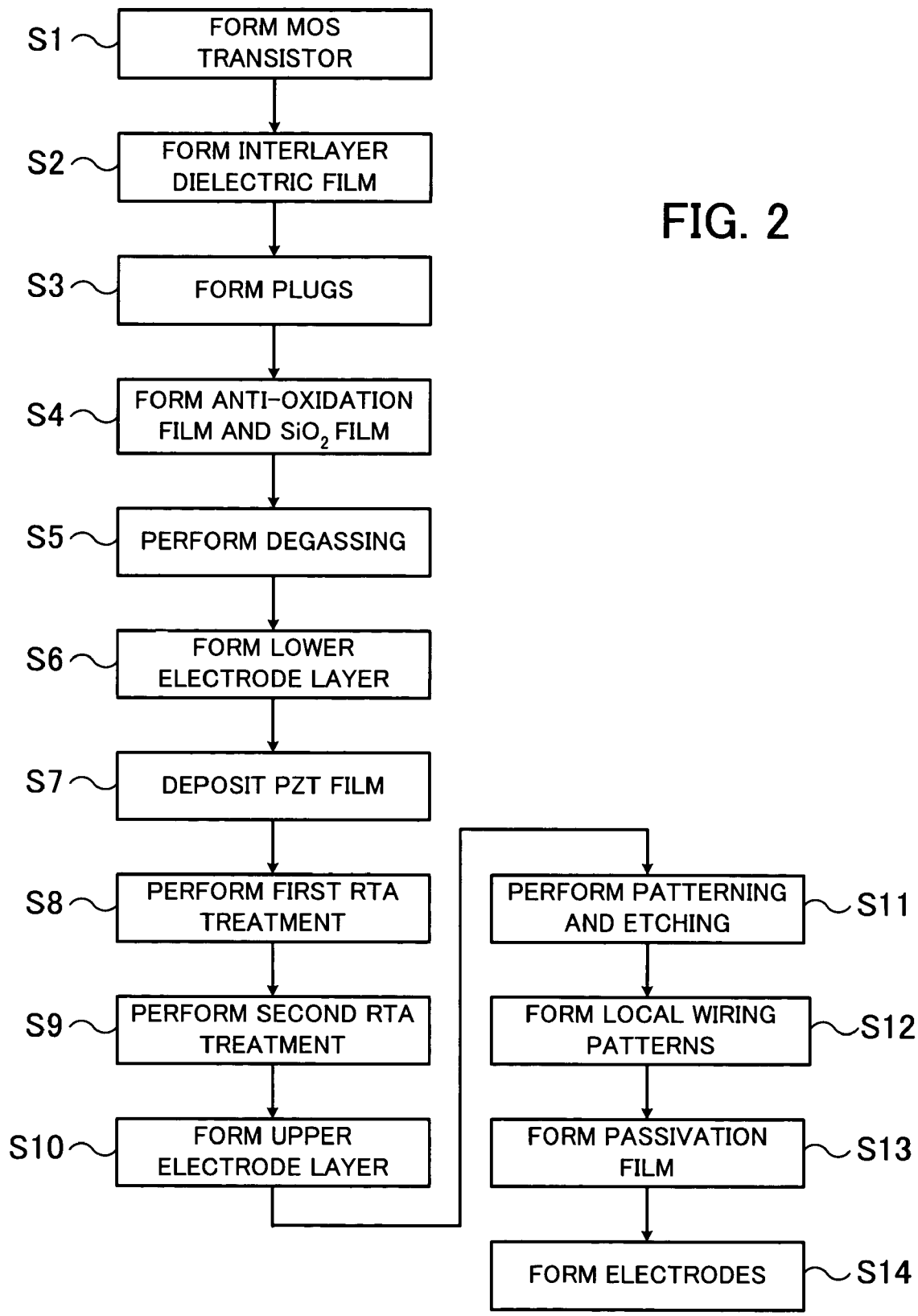
FIG. 2 shows an example of a method for fabricating an FeRAM.

The FeRAM 1 having the above structure can be fabricated according to, for example, a procedure shown in FIG. 2.

FIG. 2 shows an example of a method for fabricating the FeRAM.

The gate insulating film 6, the gate electrode 7, the sidewall insulating films 8a and 8b, and the impurity diffusion regions 9a and 9b are formed first in the element region defined by the isolation regions 5 according to an ordinary method to form the MOS transistor 3 (step S1).

An $SiO_2$ film with a thickness of about 1,000 nm is then deposited on a wafer which has a diameter of 200 mm and on which the MOS transistor 3 is formed by a chemical vapor deposition (CVD) method. The $SiO_2$ film is planarized by a chemical mechanical polishing (CMP) method to form the interlayer dielectric film 10 (step S2).

Contact holes which connect with the impurity diffusion regions 9a and 9b are made in the interlayer dielectric film 10, a tungsten film, for example, is deposited on an entire surface, the tungsten film is planarized by the CMP method, and the plugs 11a and 11b are formed (step S3).

The anti-oxidation film 12 of, for example, SiON with a thickness of about 100 nm and the $SiO_2$ film 13 with a thickness of about 130 nm are then formed (step S4). Annealing treatment is performed in an atmosphere of nitrogen ($N_2$) at a temperature of about 650° C. for about 30 minutes to perform degassing (step S5)

If the lower electrode layer 14 has, for example, a two-layer structure including a Pt film and a Ti film, then a Ti film with a thickness of about 20 nm and a Pt film with a thickness of about 175 nm are deposited in order on an entire surface by a DC sputtering method to form the lower electrode layer 14 (step S6).

A PZT film with a thickness of about 200 nm is then deposited on the lower electrode layer 14 by an RF sputtering method (step S7). In this case, a PZT target in which the composition ratio of each component is the same as that of each component in the dielectric layer 15 to be formed is used. The PZT film deposited on the lower electrode layer 14 by using such a PZT target is in an amorphous state.

To crystallize the PZT film in an amorphous state, RTA treatment is then performed by using a lamp annealer or the like (step S8). At this stage the main purpose of the RTA treatment is the formation of a PZT crystal grain. The PTA treatment is performed in an atmosphere of a mixed gas which contains $O_2$ gas at predetermined partial pressure and an inert gas, such as Ar gas or $N_2$ gas, at predetermined partial pressure. When the RTA treatment is performed, $O_2$ gas concentration in the mixed gas is about 0.1 to 50 volume percent. It is desirable that $O_2$ gas concentration in the mixed gas should be about 1 to 5 volume percent. Furthermore, it is more desirable that $O_2$ gas concentration in the mixed gas should be about 2 to 5 volume percent. For example, the RTA treatment is performed at a total gas flow rate of 2 SLM (1 SLM=1 L/min (0° C. and 101.3 kPa)), an $O_2$ gas concentration of about 2.5 volume percent (the rest is Ar gas or $N_2$ gas), a temperature of about 600° C., and a temperature raising rate of about 125° C./sec for about 90 seconds. The details of the RTA treatment and a property of a PZT crystal obtained thereby will be described later.

After the RTA treatment is performed in step S8, RTA treatment is performed again under other conditions (step S9). At this stage the main purpose of the RTA treatment is to grow the PZT crystal grain obtained by the previous RTA treatment. For example, the RTA treatment is performed at an $O_2$ gas flow rate of 2 SLM, a temperature of about 750° C., and a temperature raising rate of about 125° C./sec for about 60 seconds. The dielectric layer 15 of PZT having predetermined crystal structure is formed by performing the RTA treatment (hereinafter referred to as the "first RTA treatment") in step S8 and the RTA treatment (hereinafter referred to as the "second RTA treatment") in step S9.

After the second RTA treatment is performed in step S9, an $IrO_2$ film with a thickness of about 250 nm is formed to form the upper electrode layer 16 (step S10).

Patterning and etching are performed in order on the upper electrode layer 16, the dielectric layer 15, and the lower electrode layer 14 to leave these layers only in predetermined regions in tiers. By doing so, the ferroelectric capacitor 2 is formed (step S11).

The interlayer dielectric film 18 is then formed on an entire surface, contact holes which connect with the lower electrode layer 14, the upper electrode layer 16, and the plug 11b are made, and the local wiring patterns 19a and 19b are formed (step S12).

After the passivation film 20 is formed on an entire surface (step S13), contact holes which connect with the plug 11a and the local wiring pattern 19a are made and the electrodes 21 and 22 are formed in these contact holes (step S14). The FeRAM 1 is fabricated by the above procedure.

The first RTA treatment performed in the above step S8 will now be described in more detail.

Figure 3:
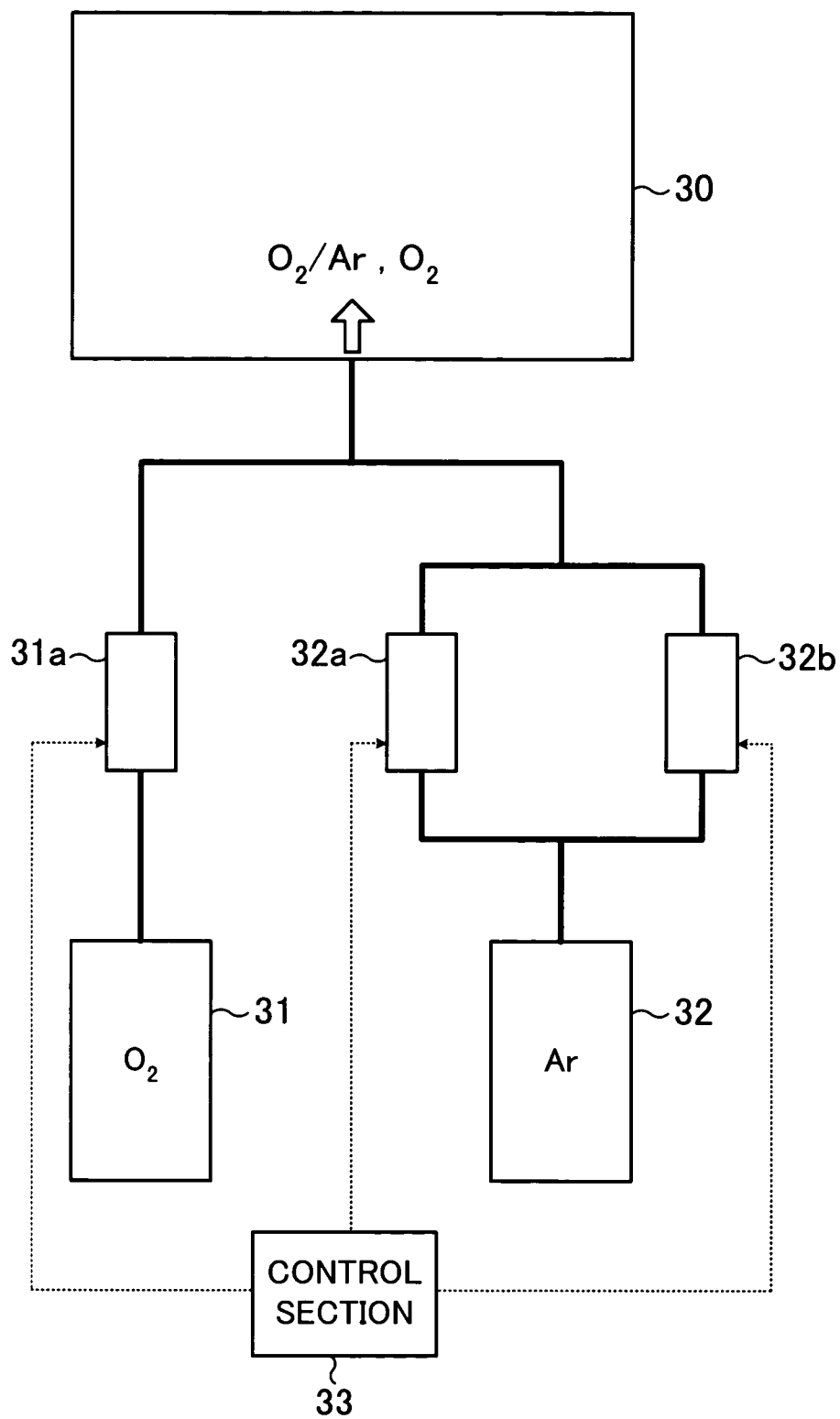
FIG. 3 shows an example of the structure of a gas introduction line used for RTA treatment.

FIG. 3 shows an example of the structure of a gas introduction line used for the RTA treatment.

A line for introducing $O_2$ gas into the lamp annealer or the like and a line for introducing Ar gas or $N_2$ gas are necessary for the above first RTA treatment in which a mixed gas that contains the $O_2$ gas and the Ar gas is used. In FIG. 3, an $O_2$ gas introduction line which leads from an $O_2$ gas source 31 to a chamber 30 of the lamp annealer or the like and an Ar gas introduction line which leads from an Ar gas source 32 to the chamber 30 are shown.

One $O_2$ gas mass flow controller 31a is located midway along the $O_2$ gas introduction line as a flow rate controller. The flow rate of $O_2$ gas introduced into the chamber 30 is controlled by the $O_2$ gas mass flow controller 31a.

Similarly, mass flow controllers are located midway along the Ar gas introduction line as flow rate controllers for controlling the flow rate of Ar gas introduced into the chamber 30. However, two mass flow controllers are located midway along the Ar gas introduction line. One is a purge mass flow controller 32a for controlling the flow rate of Ar gas used for purging air which flows into the chamber 30 at wafer transportation time. The other is a concentration adjustment mass flow controller 32b for controlling the flow rate of Ar gas to adjust $O_2$ gas concentration at the time of raising and maintaining the temperature.

On-off control over the $O_2$ gas mass flow controller 31a, the purge mass flow controller 32a, or the concentration adjustment mass flow controller 32b is exercised by a control section 33. That is to say, whether to flow gas the flow rate of which is controlled down each mass flow controller (to the chamber 30 side) is controlled by the control section 33.

Figure 4:
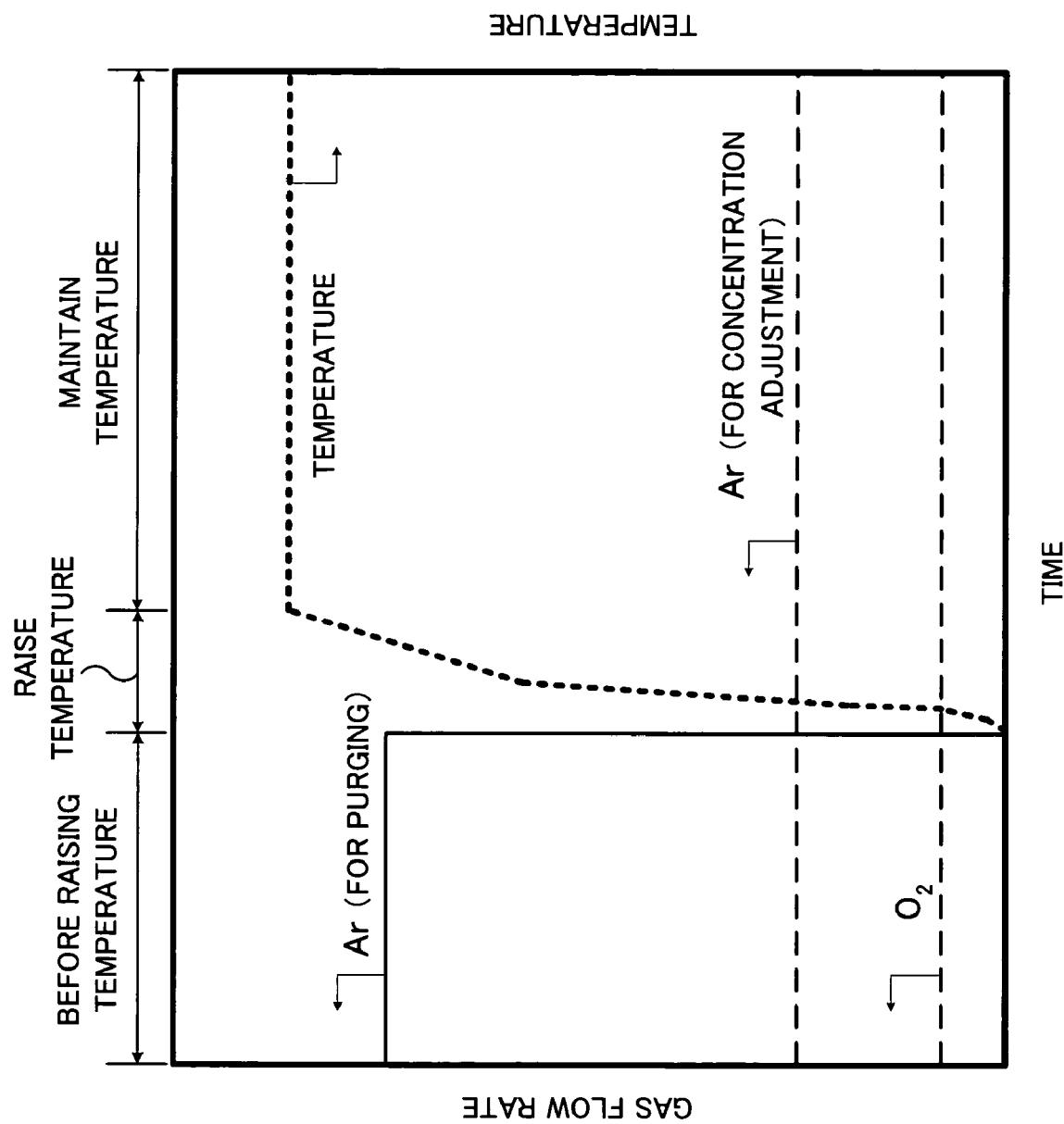
FIG. 4 shows a procedure for first RTA treatment.

The first RTA treatment is performed according to, for example, a procedure shown in FIG. 4 by using the above gas introduction lines.

FIG. 4 shows a procedure for the first RTA treatment. In FIG. 4, a horizontal axis indicates time and a vertical axis indicates a gas flow rate and temperature.

When the first RTA treatment is performed, each of the $O_2$ gas mass flow controller 31a, the purge mass flow controller 32a, and the concentration adjustment mass flow controller 32b is set in advance to a predetermined flow rate value.

To be concrete, if the first RTA treatment is performed at a total gas flow rate of 2 SLM and an $O_2$ gas concentration of about 2.5 volume percent (the rest is Ar gas), these flow rate values are selected so that $O_2$ gas concentration in the chamber 30 will be about 2.5 volume percent (the rest is Ar gas) by the presence of $O_2$ gas the flow rate of which is controlled by the $O_2$ gas mass flow controller 31a and Ar gas the flow rate of which is controlled by the concentration adjustment mass flow controller 32b. In this case, Ar gas which flows from the purge mass flow controller 32a is not taken into consideration. The purge mass flow controller 32a is set to, for example, 20 SLM because Ar gas must be provided at a great flow rate in order to purge air which flows into the chamber 30.

After each mass flow controller is set in advance to the predetermined flow rate value in this way, the wafer to be treated, that is to say, the wafer on which the PZT film is deposited is transported into the chamber 30. All of the $O_2$ gas mass flow controller 31a, the purge mass flow controller 32a, and the concentration adjustment mass flow controller 32b are put into the ON state and $O_2$ gas and Ar gas are introduced into the chamber 30 at the predetermined flow rates.

That is to say, at a stage before raising the temperature shown in FIG. 4, $O_2$ gas the flow rate of which is set to a value used at the time of raising and maintaining the temperature by the $O_2$ gas mass flow controller 31a is introduced into the chamber 30 from the $O_2$ gas introduction line. In addition, a comparatively small amount of Ar gas the flow rate of which is set to a value used at the time of raising and maintaining the temperature by the concentration adjustment mass flow controller 32b and a large amount of Ar gas the flow rate of which is set to a value used for purging air which flows into the chamber 30 by the purge mass flow controller 32a are introduced into the chamber 30 from the Ar gas introduction line.

After the air which flows into the chamber 30 is fully purged, only the purge mass flow controller 32a is put into the OFF state with the $O_2$ gas mass flow controller 31a and the concentration adjustment mass flow controller 32b kept in the ON state. The raising of the temperature in the first RTA treatment is begun (stage of raising the temperature shown in FIG. 4) and a predetermined temperature is maintained for a certain period of time (stage of maintaining the temperature shown in FIG. 4).

In this example, as stated above, the introduction of Ar gas into the chamber 30 is controlled by the two mass flow controllers, that is to say, by the purge mass flow controller 32a and the concentration adjustment mass flow controller 32b. In this case, the purge mass flow controller 32a is in the ON state only during the stage before raising the temperature in the first RTA treatment, while the $O_2$ gas mass flow controller 31a and the concentration adjustment mass flow controller 32b are in the ON state during the stage before raising the temperature and during raising and maintaining the temperature. As a result, even when the purge mass flow controller 32a is put into the OFF state, a mixed gas which contains $O_2$ gas and Ar gas and in which $O_2$ gas concentration is a predetermined value can stably be introduced into the chamber 30 by the $O_2$ gas mass flow controller 31a and the concentration adjustment mass flow controller 32b.

The result of an examination of a property of a PZT crystal obtained by following the above procedure will now be described.

Figure 5:
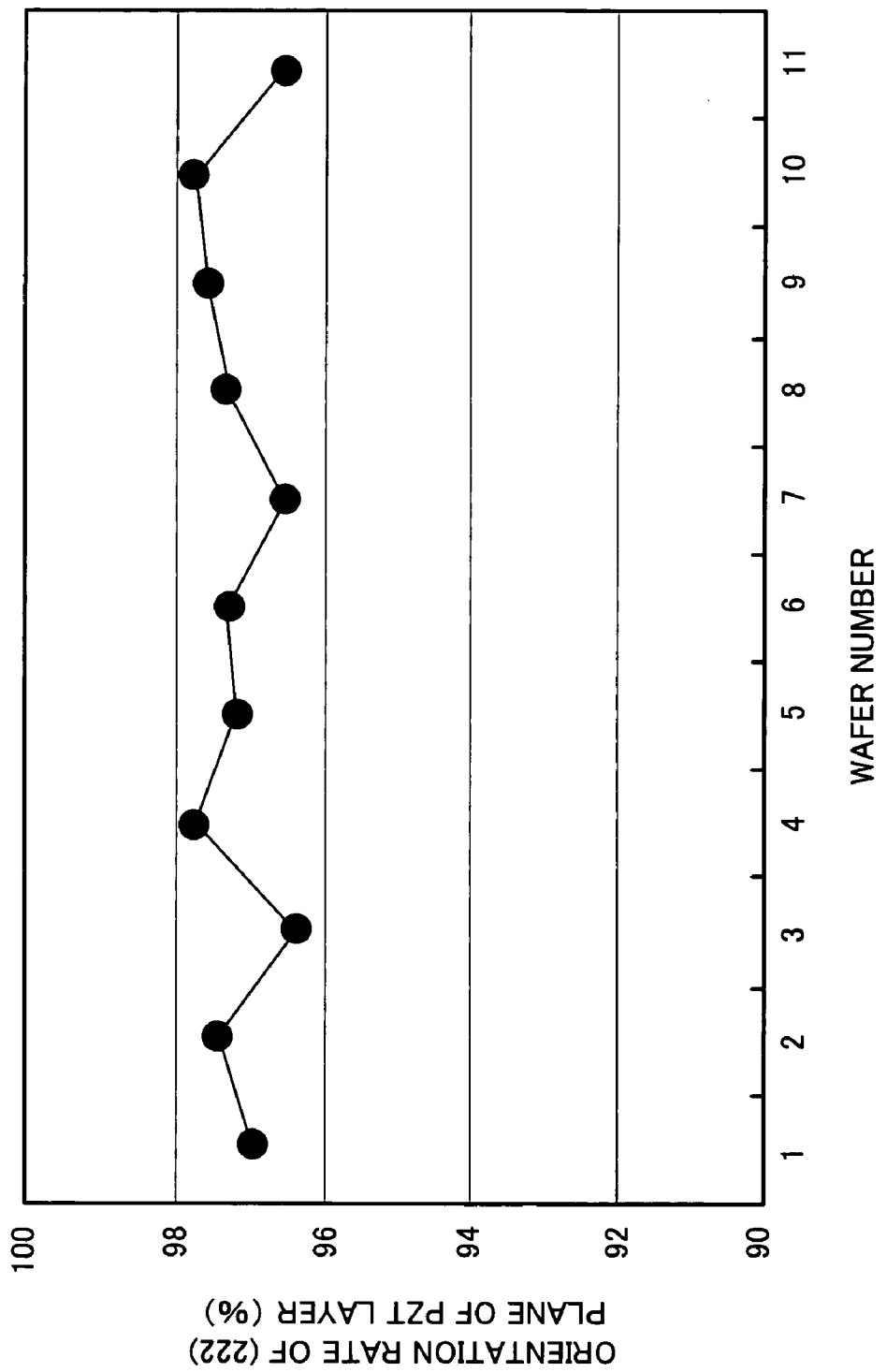
FIG. 5 shows an example of variation in the orientation rate of a PZT layer.

FIG. 5 shows an example of variation in the orientation rate of the PZT layer. In the case of FIG. 5, to crystallize the PZT layer, the procedure shown in FIG. 4 is applied only to the first RTA treatment in the above step S8 and the conventional procedure is applied to the second RTA treatment in the above step S9. In FIG. 5, a horizontal axis indicates a wafer number and a vertical axis indicates the orientation rate (%) of the (222) plane of the PZT layer.

After the first RTA treatment is performed according to the above procedure and the second RTA treatment is performed, measurements are made by utilizing the XRD. Integrated intensity for the (101), (100), and (222) planes of the PZT layer is found from their diffraction peaks and the orientation rate of the (222) plane of the PZT layer is calculated by orientation rate (%) of (222) plane of PZT layer={integrated intensity for (222) plane of PZT layer}× 100/[{integrated intensity for (100) plane of PZT layer}+ {integrated intensity for (101) plane of PZT layer}+{integrated intensity for (222) plane of PZT layer}].

The first RTA treatment is performed at a total gas flow rate of 2 SLM, an $O_2$ gas concentration of about 2.5 volume percent (the rest is Ar gas or $N_2$ gas), a temperature of about 600° C., and a temperature raising rate of about 125° C./sec for about 90 seconds. The second RTA treatment is performed at an $O_2$ gas flow rate of 2 SLM, a temperature of about 750° C., and a temperature raising rate of about 125° C./sec for about 60 seconds. All conditions under which crystallization annealing is performed on each wafer are the same.

As shown in FIG. 5, the orientation rate of the (222) plane of the PZT layer on each wafer is 96% or greater and is high. In addition, variation in the orientation rate of the (222) plane of the PZT layer among wafers is slight. As stated above, by applying the procedure shown in FIG. 4 to the first RTA treatment, the (100) or (101) plane orientation of the PZT layer can be suppressed and the (222) plane orientation of the PZT layer can be enhanced.

Figure 8:
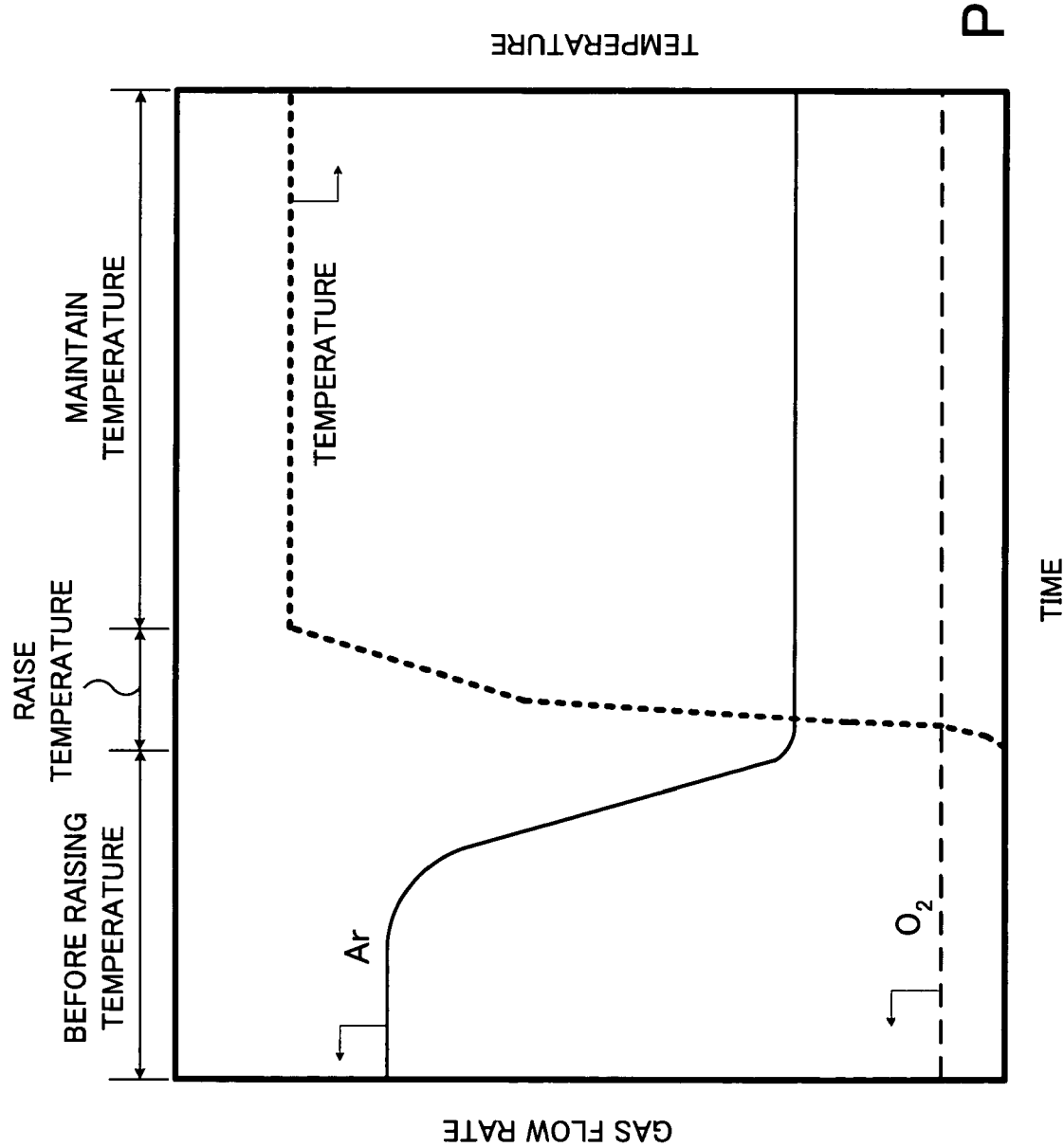
FIG. 8 is a view for describing an example of a conventional crystallization annealing method.
Figure 9:
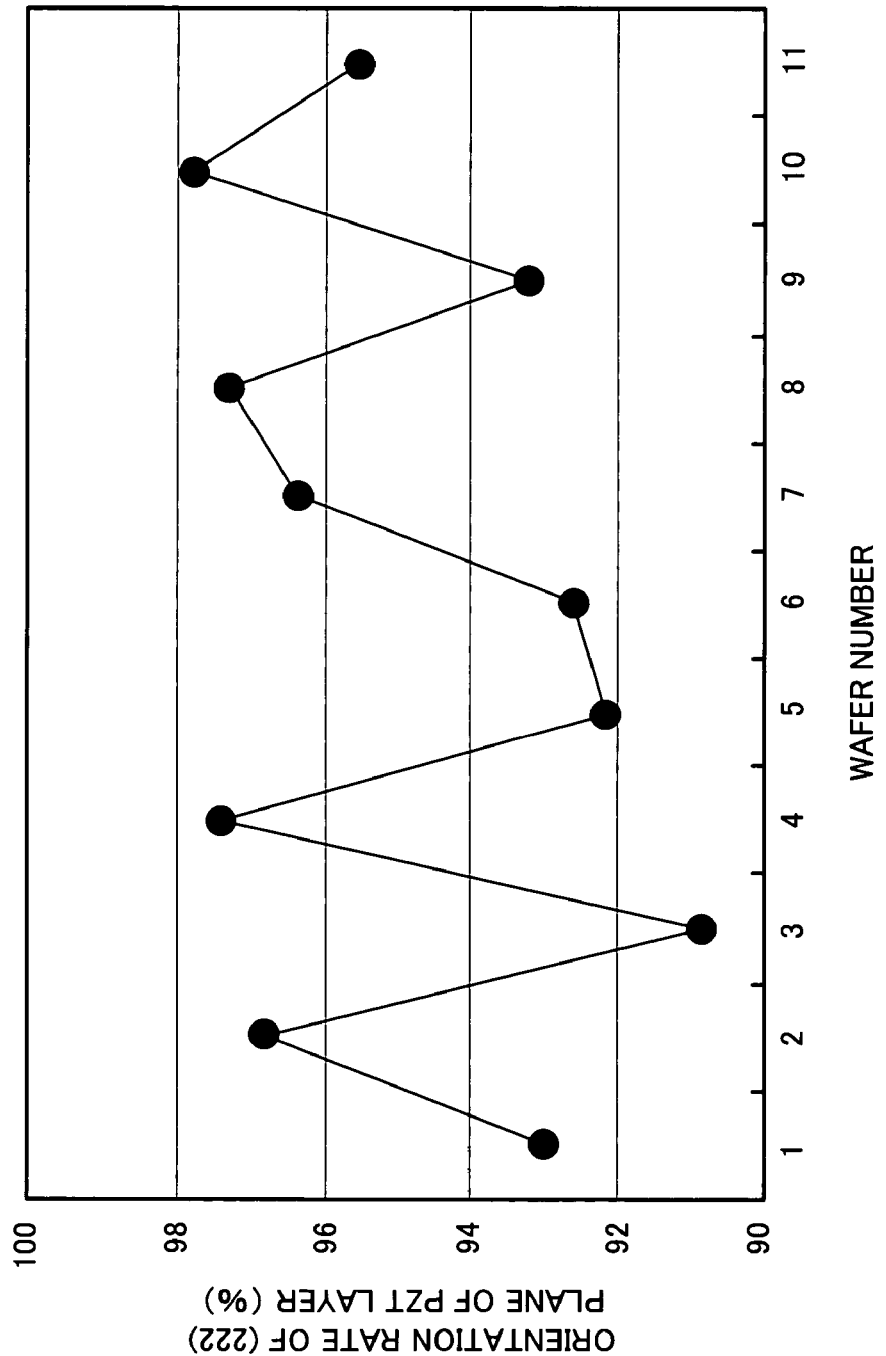
FIG. 9 shows an example of variation in the orientation rate of PZT obtained by using the conventional crystallization annealing method.

As stated above, the two mass flow controllers, or the $O_2$ gas mass flow controller and the purge and concentration adjustment mass flow controller, have conventionally been used for introducing a predetermined amount of $O_2$ gas and a large amount of Ar gas into the chamber before raising the temperature. By doing so, air which flows into the chamber at the time of transporting the wafer is purged. After the elapse of a certain period of time, the flow rate of Ar gas is reduced so that $O_2$ gas concentration in a mixed gas of $O_2$ gas and Ar gas will be a predetermined value. Immediately after that, the raising of the temperature is begun (see FIG. 8). With this method, however, $O_2$ gas concentration in a mixed gas of $O_2$ gas and Ar gas is not stable, so there is variation in the orientation rate of the (222) plane of the PZT layer among the wafers (see FIG. 9). The results shown in FIG. 9 are obtained by making measurements under the same conditions that are adopted in FIG. 5. In the case of FIG. 9, however, the first RTA treatment is performed by applying the procedure shown in FIG. 8.

By using the gas introduction lines shown in FIG. 3 and performing the first RTA treatment by applying the procedure shown in FIG. 4, PZT crystals which have a high orientation rate of the (222) plane and among which variation in the orientation rate of the (222) plane is small can be obtained. As a result, the amount of switching electric charges $Q_{SW}$ and the yield of FeRAMs can be stabilized.

In this example, the $O_2$ gas mass flow controller 31a is used for providing $O_2$ gas and the purge mass flow controller 32a and the concentration adjustment mass flow controller 32b are used for providing Ar gas. That is to say, a total of three mass flow controllers are used for stably introducing a mixed gas of $O_2$ gas and Ar gas. However, gas introduction lines using more than three mass flow controllers can be built. For example, if RTA treatment is performed by using more kinds of gases, the number of mass flow controllers should be increased and gas introduction lines should be properly built after the above example.

Another procedure that is applicable to the first RTA treatment in the above step S8 will now be described.

Figure 6:
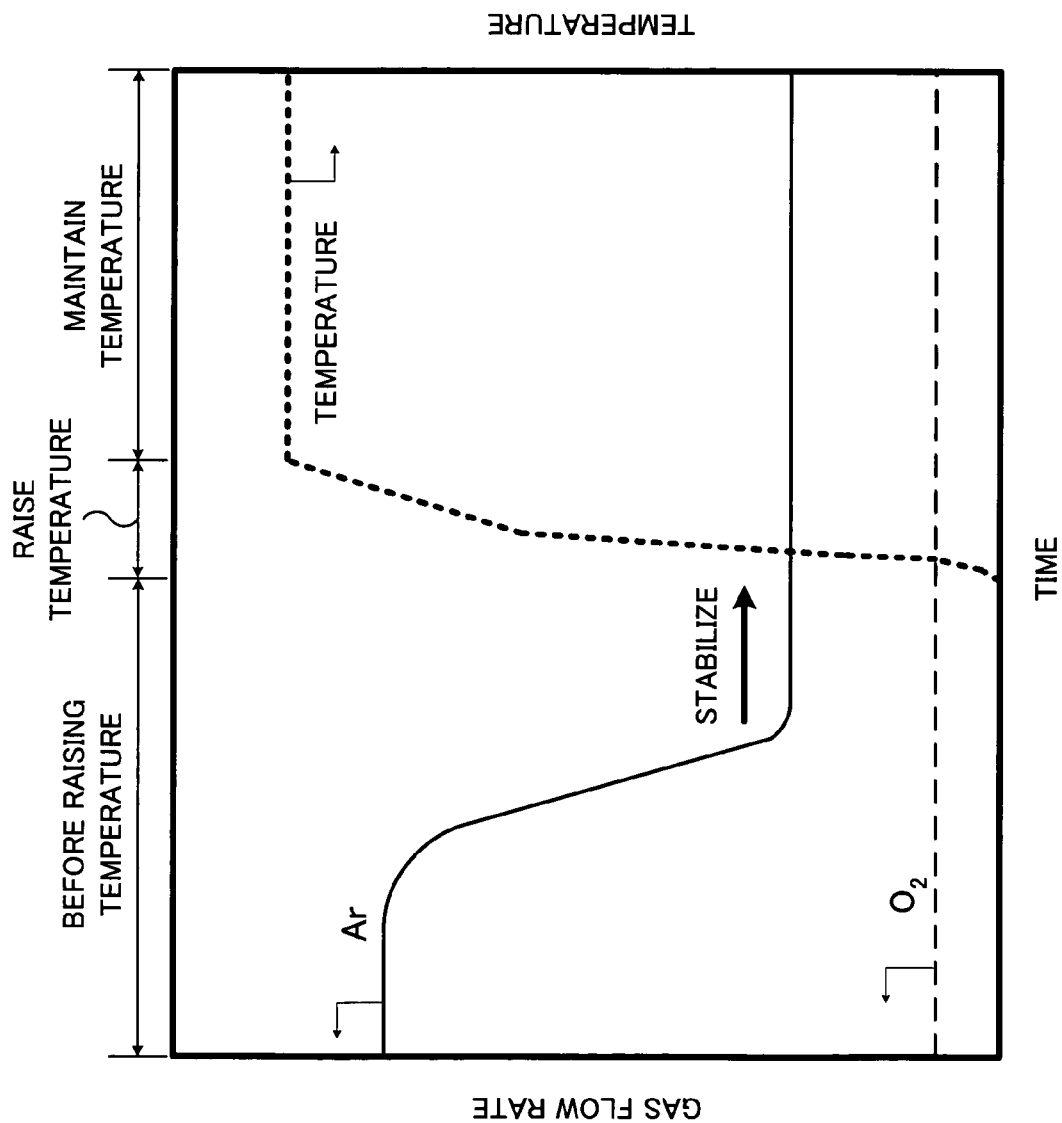
FIG. 6 shows another procedure for the first RTA treatment.

FIG. 6 shows another procedure for the first RTA treatment.

In the procedure shown in FIG. 6, two mass flow controllers, or an $O_2$ gas mass flow controller and a purge and concentration adjustment mass flow controller, are used. This is the same with the conventional case. Time that elapses after a reduction in the flow rate of a large amount of Ar gas introduced for purging air which flows in at wafer transportation time and before the beginning of the raising of the temperature is lengthened. By doing so, the flow rates of $O_2$ gas and Ar gas can be stabilized before the raising of the temperature is begun. Accordingly, $O_2$ gas concentration in a mixed gas of $O_2$ gas and Ar gas immediately before the raising of the temperature can be stabilized.

By performing the first RTA treatment according to the procedure shown in FIG. 6, PZT crystals which have a high orientation rate of the (222) plane and among which variation in the orientation rate of the (222) plane is small can be obtained. In this case, there is no need to change the conventional gas introduction lines. As a result, the amount of switching electric charges $Q_{SW}$ and the yield of FeRAMs can be stabilized.

In the above example, the case where the procedure shown in FIG. 4 or 6 is applied to the FeRAM fabrication method in which the PZT film is deposited (step S7), in which the first RTA treatment and the second RTA treatment are performed (steps S8 and S9), and in which the upper electrode layer is formed (step S10) is described. However, the procedure shown in FIG. 4 or 6 can also be applied to other FeRAM fabrication methods. For example, an FeRAM can be fabricated according to a method shown in FIG. 7. The procedure shown in FIG. 4 or 6 can be applied to this method.

Figure 7:
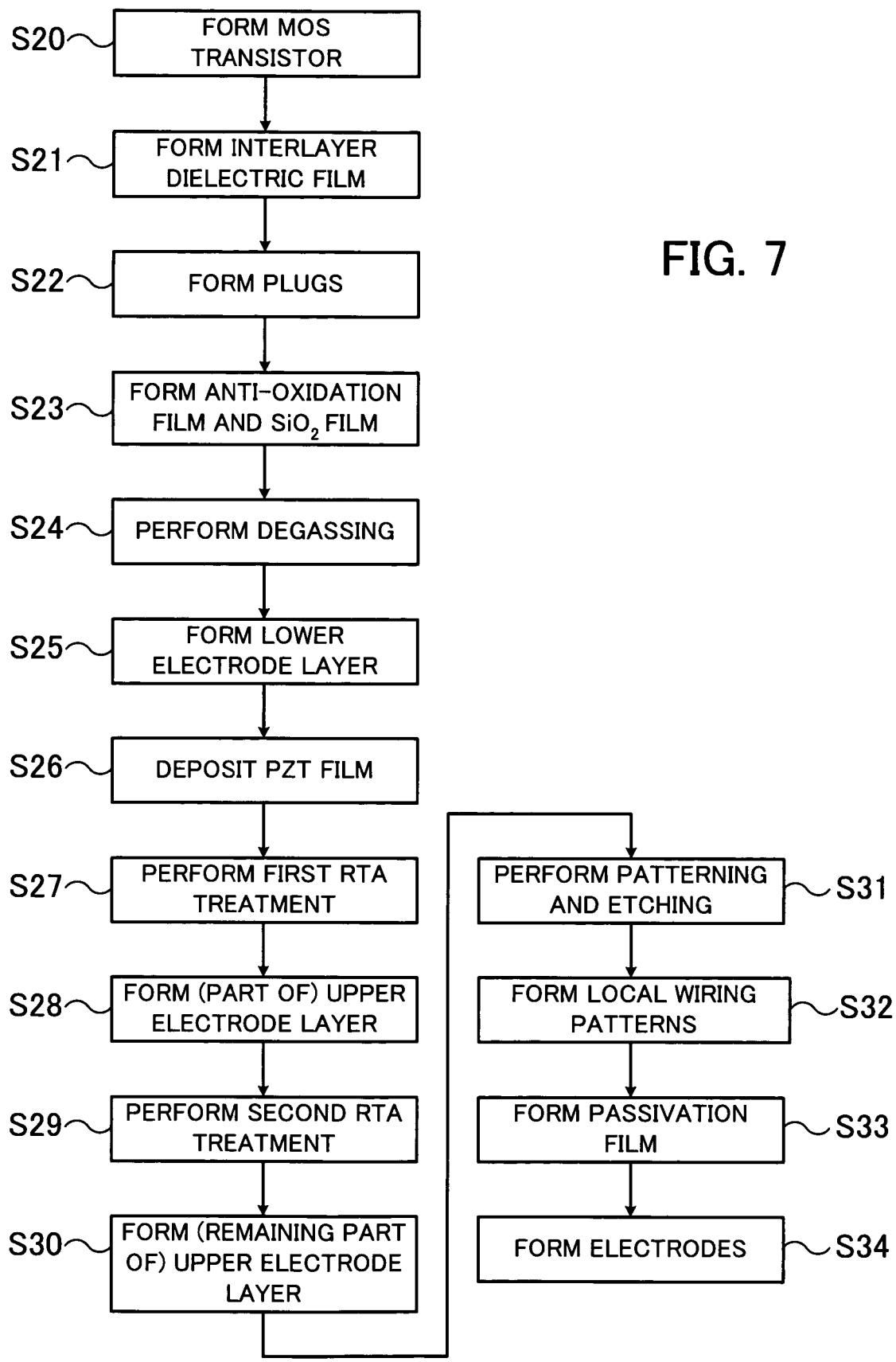
FIG. 7 shows another example of a method for fabricating an FeRAM.

FIG. 7 shows another example of a method for fabricating an FeRAM.

Steps S20 through S27 included in the FeRAM fabrication method shown in FIG. 7 are the same as steps S1 through S8 shown in FIG. 2. However, first RTA treatment in step S27 is performed, for example, in an atmosphere of a mixed gas of $O_2$ gas and Ar gas at a temperature of about 563° C. for about 90 seconds. In this first RTA treatment, the procedure shown in FIG. 4 is applied by using the gas introduction lines shown in FIG. 3. This is the same with the above step S8. Alternatively, the procedure shown in FIG. 6 is applied by using the conventional gas introduction lines.

In the FeRAM fabrication method shown in FIG. 7, after the first RTA treatment is performed, $IrO_x$ film with a thickness of about 50 nm, being part of the upper electrode layer 16, is formed first by the DC sputtering method (step S28). Second RTA treatment is then performed, for example, in an atmosphere of a mixed gas of $O_2$ gas and Ar gas ($O_2$ gas concentration is about 1 volume percent and the rest is Ar gas) at a temperature of about 708° C. for about 20 seconds (step S29). $IrO_x$ film with a thickness of about 200 nm is then formed. As a result, the upper electrode layer 16 with a total thickness of about 250 nm including the thickness of the $IrO_x$ film formed in step S28 is formed (step S30).

The subsequent steps S31 through S34 are the same as steps S11 through S14 shown in FIG. 2.

If the first RTA treatment in the FeRAM fabrication method shown in FIG. 7 is performed according to the conventional procedure (see FIG. 8), $O_2$ gas concentration immediately before the raising of the temperature is not stable and the same problem that has conventionally arisen may turn up. Therefore, when the first RTA treatment is performed, the procedure shown in FIG. 4 should be applied by using the gas introduction lines shown in FIG. 3. Alternatively, the procedure shown in FIG. 6 should be applied by using the conventional gas introduction lines. By doing so, $O_2$ gas concentration in a mixed gas of $O_2$ gas and Ar gas immediately before the raising of the temperature can be stabilized. As a result, the orientation rate of the (222) plane of the PZT layer can be improved and the amount of switching electric charges $Q_{SW}$ and the yield of FeRAMs can be stabilized.

In the FeRAM fabrication method shown in FIG. 7, the second RTA treatment is also performed in an atmosphere of a mixed gas of $O_2$ gas and Ar gas. Accordingly, it is very effective in the second RTA treatment to apply the procedure shown in FIG. 4 by using the gas introduction lines shown in FIG. 3 or to apply the procedure shown in FIG. 6 by using the conventional gas introduction lines.

In the above examples, the case where PZT is used as a ferroelectric material of which the dielectric layer 15 included in the ferroelectric capacitor 2 is formed is described. If lanthanum-doped lead zirconate titanate ((Pb, La) (Zr,Ti)O$_3$), or PLZT, is used as a ferroelectric material, the same method can be used and the same effect can be obtained.

Furthermore, in the above examples, the first RTA treatment is performed in an atmosphere of a mixed gas of O$_2$ gas and Ar gas and the second RTA treatment is performed in an atmosphere of O$_2$ gas or a mixed gas of O$_2$ gas and Ar gas. However, kinds of gases used are not limited to them. Oxidation gases other than O$_2$ gas and non-oxidation gases other than Ar gas can widely be used.

In the present invention, when heat treatment is performed in an atmosphere of a mixed gas of an oxidation gas and a non-oxidation gas after the formation of the layer of a ferroelectric material, the flow rate of the oxidation gas is controlled by one flow rate controller and the flow rate of the non-oxidation gas is controlled by a plurality of flow rate controllers. As a result, an atmosphere in which heat treatment is performed on the layer of a ferroelectric material can be stabilized and a ferroelectric capacitor having predetermined performance can be fabricated stably. In addition, semiconductor devices each having a ferroelectric capacitor can be mass-produced stably.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating a ferroelectric capacitor in which a ferroelectric material is used for forming a dielectric layer, the method comprising:
    forming a lower electrode layer;
    forming a layer of the ferroelectric material on the lower electrode layer;
    controlling, after forming the layer of the ferroelectric material, a flow rate of an oxidation gas by one flow rate controller, controlling a flow rate of a non-oxidation gas by a plurality of flow rate controllers, and performing heat treatment in an atmosphere of a mixed gas which contains the oxidation gas and the non-oxidation gas; and
    forming at least part of an upper electrode layer on the layer of the ferroelectric material after the heat treatment,
    wherein a flow rate of the non-oxidation gas used for purging is controlled by one flow rate controller of the plurality of flow rate controllers for controlling the flow rate of the non-oxidation gas and a flow rate of the non-oxidation gas used for adjusting concentration of the oxidation gas is controlled by a second flow rate controller of the plurality of flow rate controllers.

2. The method according to claim 1, wherein before raising temperature, the flow rate of the oxidation gas is controlled by the flow rate controller, a flow rate of the non-oxidation gas used for purging is controlled by one flow rate controller of the plurality of flow rate controllers, and a flow rate of the non-oxidation gas used for adjusting concentration of the oxidation gas is controlled by a second flow rate controller of the plurality of flow rate controllers; and
    at the time of raising and maintaining the temperature, a flow of the non-oxidation gas the flow rate of which is controlled by the one flow rate controller for the purging is stopped by the one flow rate controller and the oxidation gas the flow rate of which is controlled by the flow rate controller and the non-oxidation gas the flow rate of which is controlled by the second flow rate controller are made to flow.

3. The method according to claim 1, wherein the heat treatment is RTA treatment.

4. The method according to claim 1, wherein the lower electrode layer is formed of Pt.

5. The method according to claim 1, wherein the layer of the ferroelectric material is formed of PZT or PLZT.

6. The method according to claim 1, wherein the flow rate of the oxidation gas is controlled by the flow rate controller;
    the flow rate of the non-oxidation gas is controlled by the plurality of flow rate controllers; and
    the heat treatment is performed with concentration of the oxidation gas in the mixed gas at the time of raising and maintaining temperature stabilized at a predetermined value between 0.1 and 50 volume percent.

7. The method according to claim 1, further comprising, after performing the heat treatment and before forming at least part of the upper electrode layer, the process of performing second heat treatment in an atmosphere of the oxidation gas alone.

8. The method according to claim 1, further comprising, after forming at least part of the upper electrode layer, performing second heat treatment in an atmosphere of the oxidation gas and the non-oxidation gas.

9. The method according to claim 1, wherein a temperature raises after stabilizing oxidation gas concentration in a mixed gas which contains the oxidation gas and the non-oxidation gas.

10. The method according to claim 9, wherein
    temperature is begun 0.1 second or longer after obtaining composition of the mixed gas that is the same as composition required at the time of performing the heat treatment.

11. A method for fabricating a semiconductor device including a ferroelectric capacitor, the method comprising:
    forming a lower electrode layer;
    forming a layer of the ferroelectric material on the lower electrode layer;
    controlling, after forming the layer of the ferroelectric material, a flow rate of an oxidation gas by one flow rate controller, controlling a flow rate of a non-oxidation gas by a plurality of flow rate controllers, and performing heat treatment in an atmosphere of a mixed gas which contains the oxidation gas and the non-oxidation gas; and
    forming at least part of an upper electrode layer on the layer of the ferroelectric material after the heat treatment,
    wherein a flow rate of the non-oxidation gas used for purging is controlled by one flow rate controller of the plurality of flow rate controllers for controlling the flow rate of the non-oxidation gas and a flow rate of the non-oxidation gas used for adjusting concentration of the oxidation gas is controlled by a second flow rate controller of the plurality of flow rate controllers.

12. The method according to claim 11, wherein before raising temperature, the flow rate of the oxidation gas is controlled by the flow rate controller, a flow rate of the non-oxidation gas used for purging is controlled by one flow rate controller of the plurality of flow rate controllers, and a flow rate of the non-oxidation gas used for adjusting concentration of the oxidation gas is controlled by a second flow rate controller of the plurality of flow rate controllers; and
    at the time of raising and maintaining the temperature, a flow of the non-oxidation gas the flow rate of which is controlled by the one flow rate controller for the purging is stopped by the one flow rate controller and the oxidation gas the flow rate of which is controlled by the flow rate controller and the non-oxidation gas the flow rate of which is controlled by the second flow rate controller are made to flow.

13. The method according to claim 11, wherein the heat treatment is RTA treatment.

14. The method according to claim 11, wherein the lower electrode layer is formed of Pt.

15. The method according to claim 11, wherein the layer of the ferroelectric material is formed of PZT or PLZT.

16. The method according to claim 11, wherein the flow rate of the oxidation gas is controlled by the flow rate controller;
the flow rate of the non-oxidation gas is controlled by the plurality of flow rate controllers; and
the heat treatment is performed with concentration of the oxidation gas in the mixed gas at the time of raising and maintaining temperature stabilized at a predetermined value between 0.1 and 50 volume percent.

17. The method according to claim 11, further comprising, after performing the heat treatment and before forming at least part of the upper electrode layer, performing second heat treatment in an atmosphere of the oxidation gas alone.

18. The method according to claim 11, further comprising, after forming at least part of the upper electrode layer, performing second heat treatment in an atmosphere of the oxidation gas and the non-oxidation gas.

* * * * *